United States Patent
Carducci et al.

(10) Patent No.: US 8,492,660 B2
(45) Date of Patent: Jul. 23, 2013

(54) ADA COMPLIANT RF SHIELDED DOOR SYSTEMS AND RELATED METHODS

(76) Inventors: Dominick Carducci, Great Falls, VA (US); Glenn A. McNemar, Alexandria, VA (US); Mary R. Castle, White Plains, MD (US); Robert A. Wiatr, Manchester, CT (US)

( * ) Notice: Subject to any disclaimer, the term of this patent is extended or adjusted under 35 U.S.C. 154(b) by 140 days.

(21) Appl. No.: 12/256,431

(22) Filed: Oct. 22, 2008

(65) Prior Publication Data

US 2010/0096180 A1    Apr. 22, 2010

(51) Int. Cl.
*H01R 4/00* (2006.01)
*H01R 4/48* (2006.01)
*H05K 9/00* (2006.01)

(52) U.S. Cl.
USPC ............ 174/364; 174/374; 49/467; 49/477.1; 277/646

(58) Field of Classification Search
USPC .......... 174/364, 374, 382; 277/646; 52/204.1; 49/467, 477.1
See application file for complete search history.

(56) References Cited

U.S. PATENT DOCUMENTS

| | | | | |
|---|---|---|---|---|
| 4,177,353 | A * | 12/1979 | McCormack | 174/374 |
| 4,370,831 | A | 2/1983 | Hamilton | |
| 4,371,175 | A * | 2/1983 | Van Dyk, Jr. | 174/357 |
| 4,746,765 | A | 5/1988 | Mallott | |
| 5,214,241 | A * | 5/1993 | Benwell | 174/364 |
| 5,225,631 | A * | 7/1993 | Lee et al. | 277/646 |
| 6,289,635 | B1 * | 9/2001 | Procton et al. | 49/467 |
| 7,456,365 | B2 * | 11/2008 | Gilliland et al. | 174/356 |
| 2007/0007037 | A1 * | 1/2007 | Diaferia | 174/382 |

* cited by examiner

*Primary Examiner* — Hung Ngo
(74) *Attorney, Agent, or Firm* — Capitol Patent & Trademark Law Firm, PLLC

(57) ABSTRACT

Radio-frequency (RF) leakage from shielded enclosures is minimized while ensuring applicable RF attenuation standards and access requirements of the Americans with Disabilities Act (ADA) by attaching an inflatable bladder to a door of an enclosure. Substantially surrounding the bladder is an electrically conductive material. When the bladder is inflated it makes contact with conductive material which in turn makes conductive contact with the door frame to create an RF seal. The use of the bladder and conductive material provides an improved RF seal and allows for the use of a low-profile threshold that permits ADA access to, and from, the enclosure.

8 Claims, 4 Drawing Sheets

ADA COMPLIANT RF SHIELDED DOOR SYSTEMS AND RELATED METHODS

BACKGROUND OF THE INVENTION

Governments need to be able to communicate on a worldwide basis for diplomatic, economic and development reasons among others. Without taking precautions, it could be possible to eavesdrop on these communications by detecting even miniscule electromagnetic energy emitted by communications apparatus.

In order to be safe from increasingly sophisticated electronic eavesdropping techniques, governments typically require that their offices conduct sensitive communications from inside a special shielded enclosure that eliminates or, at least, drastically minimizes (i.e., attenuates) electromagnetic leakage especially at radio-frequencies (RF). The extent of attenuation from RF emissions within an enclosure is the subject of a variety of technical standards. As an example, in typical U.S. government specifications, e.g., NSA 65-6/94-106, the RF attenuation necessary to secure these communications is at least 100 dB at a frequency of 10 GHz.

Because the complexity of secure communications from enclosures worldwide varies considerably, the enclosures themselves vary in size from small chambers to entire suites of electromagnetically secure rooms. The doors to these enclosures are perhaps the most vulnerable to leakage of RF—RF emissions that escape the enclosure. Current doors are designed with heavy-duty metal shielding and heavy latches that attempt to seal the enclosure from RF leaks. These doors are heavy and, therefore, expensive to ship around the world. It is a challenge to handle them without damage, and they are hard to install. The conventional means for allowing such doors to open and close repeatedly while still maintaining a seal against RF leakage when the door is closed is by using so-called "finger stock". Typically manufactured from copper, finger stock is installed around a door frame. A corresponding knife-edge, often brass, is installed on the door's perimeter. Both the finger stock and the knife-edge are exposed when the door is opened, making them susceptible to accidental deformation or injury from persons or equipment entering or exiting the RF shielded enclosure. When the door is closed, a heavy-duty latch causes the knife edge perimeter to contact and pressure the finger stock to form a RF seal. The door's inner edges must fit precisely against the finger stock frame. If, however, the finger stock becomes distorted, bent or out of shape, as often happens, or if the knife edge is bent or deformed then imperfections are created which allow RF emissions to leak out of the enclosure. At microwave frequencies, even extremely small holes, defects or other imperfections can be a source of an RF leak.

An example of a prior art door is shown in FIG. 1. A close up view of finger stock 102 on a RF door 103 is shown in a closed position. The finger stock 102 is installed around the edge perimeter 104 of the door frame 101. A corresponding knife-edge is installed on the door's edge perimeter 104. To provide complete sealing against RF leakage, the finger stock 102 must exist around the entire perimeter of the door frame. When the door is closed, a heavy-duty latch (not shown) causes the knife edge perimeter 104 on the door 103 to contact and pressure the finger stock 102 of the door frame 101 thereby forming an RF seal. An RF seal is said to exist for an enclosure when RF transmissions outside the enclosure, which the door 103 is a part of, do not penetrate into the enclosure and RF transmissions generated within the enclosure do not escape. In both instances any leakage of RF transmissions into, or out of, the enclosure can be measured by applicable technical standards. Continuing, with the door 103 shown in FIG. 1, the knife edge 104 may be placed in many orientations relative to the finger stock 102. Over time, after the door 103 is opened and closed a number of times, finger stock 102 becomes worn and needs to be replaced.

Doors to larger or busier facilities may be opened and closed many times, inevitably causing increased wear and tear at the door edges. Such wear and tear often causes the enclosure to no longer meet applicable RF attenuation specifications. Realizing the problems associated with such wear and tear, users of existing doors must maintain their doors periodically so that the doors will continue to function in accord with applicable technical standards. Among other maintenance requirements, finger stock must be cleaned often and replaced at least every six months by a skilled tradesman.

The finger-stock used to help reduce RF leakage must exist around the entire perimeter of the door frame, including the floor, to provide adequate RF signal attenuation. For this reason, the door frames used in existing RF shielded enclosures have high, raised structural thresholds necessary to hold the finger stock. Accordingly, current RF shielded doors using finger stock will not meet the access requirements of the Americans with Disabilities Act of 1990, popularly known as the ADA. See Pub.L. 101-336, 104 Stat. 327 (Jul. 26, 1990) codified at 42 U.S.C. §12101 et seq.

The problems outlined above suggest there is a strong need to minimize RF leakage from a shielded enclosure without using finger stock while ensuring that applicable RF attenuation standards and access requirements of the ADA are met or exceeded.

SUMMARY OF THE INVENTION

The inventors have recognized that the above problems may be solved by a radio-frequency shielded door system according to the invention disclosed herein. An exemplary embodiment of the invention may comprise: a door frame attachable to an opening in a radio frequency shielded enclosure; a door, attachable to said door frame, to allow passage into and out of said radio-frequency shielded enclosure through a passageway; a threshold attachable to said door frame, for placement between the floor and said opening; a bladder for placement between the door and door frame; an electrically conductive material for placement between the bladder and door frame; and a subsystem operable to inflate or deflate said bladder, wherein an inflated bladder contacts said conductive material which in turn contacts said door frame when said door is in a closed position.

In another embodiment of the invention the problems set forth above may be solved by providing a radio-frequency shielded door that may comprise: a bladder attachable to said door; an electrically conductive material, for placement around said bladder; and a subsystem operable to inflate or deflate said bladder, wherein an inflated bladder contacts said conductive material.

In a third embodiment of the invention a control subsystem for a radio-frequency door is provided that may comprise: means for supplying electrical power; means for inflating a bladder with compressed air; means for deflating said bladder; and means for controlling the inflation of said bladder in such a way that said bladder contacts said conductive material which in turn contacts said door frame when said door is in a closed position.

In addition to the apparatuses set forth above, the present invention also provides methods for minimizing radio-frequency leakage from a radio-frequency door that may comprise: closing the door; activating a switch that controls a bladder located on the edge perimeter of the door; and inflating a bladder until a conductive material substantially surrounding the bladder contacts a door frame of said radio-frequency enclosure to prevent radio-frequency leakage.

Other inventive aspects of the invention are discussed below.

DETAILED DESCRIPTION OF THE INVENTION, WITH EXAMPLES

Figure 1:
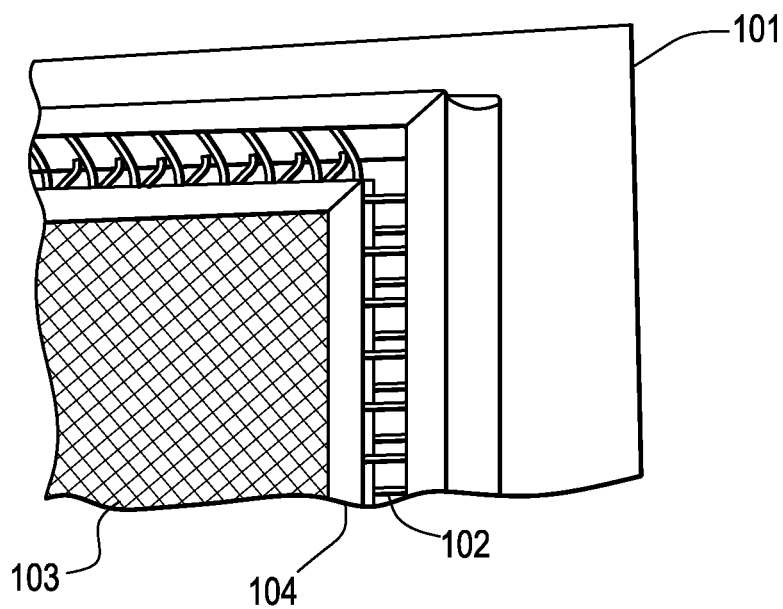
FIG. 1 illustrates a prior art RF shielded door wherein an RF seal is formed using finger stock.

Referring now to FIGS. 2A, 2B, 3 and 4 there is shown details of exemplary embodiments of the invention.

In one embodiment of the invention, FIGS. 2A, 2B, 3 and 4 depict a radio-frequency shielded door that may include: a door frame 301 attachable to an opening in a radio frequency shielded enclosure 304; a door 207, attachable to said door frame 301, to allow passage into and out of the radio-frequency shielded enclosure through a passageway; a threshold 305 attachable to the door frame 301 for placement between a floor and said opening; a bladder 204 that may extend around an edge perimeter of the door 207 and may attach to the door 207 for placement between the door 207 and door frame 301; an electrically conductive material 206 for placement around the bladder 204 and between the bladder 204 and door frame 301; and a subsystem 400 operable to inflate or deflate the bladder 204 forcing the inflated bladder in contact with the conductive material, wherein the conductive material 206 in turn contacts the door frame 301 when the door 207 is in a closed position. Together, the elements above may be referred to as an RF shielded door system.

Figure 2A:
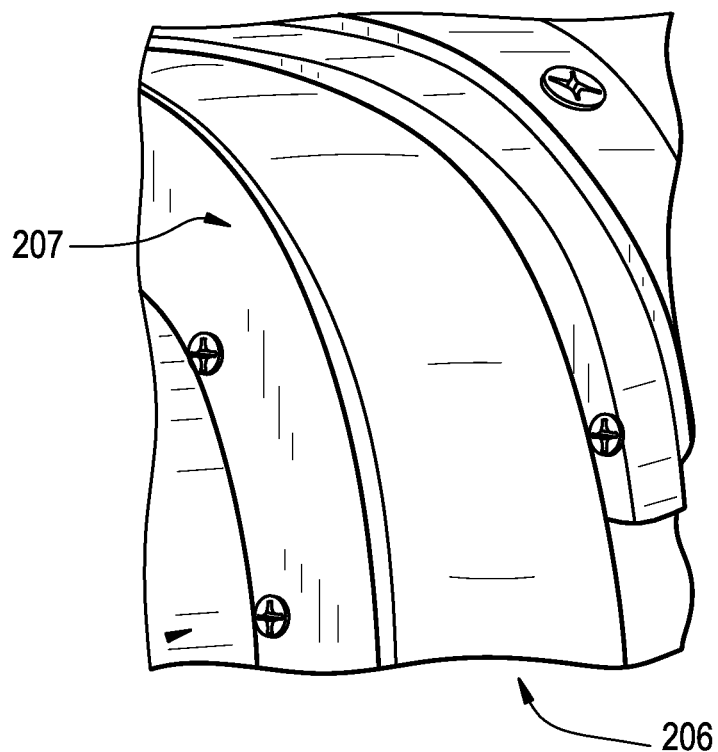
FIGS. 2A and 2B illustrate an example of a shielded door system, including an inflatable bladder covered by a conductive material, according to an embodiment of the invention.
Figure 2B:
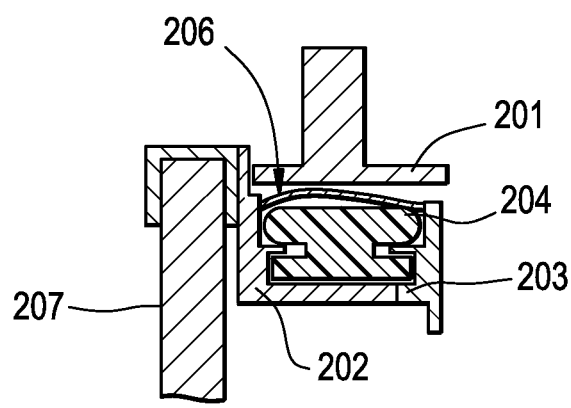

More particularly, in accordance with an embodiment of the invention FIG. 2B depicts a novel bladder 204 recessed within a door 207. The bladder rests within brackets 202 and 203. In this embodiment, when the bladder 204 is inflated electrically conductive material 206 covering the bladder 204 is caused to expand outwards and contact door jam 201, attachable to a part of door frame 301. Following expansion, the conductive material uniformly contacts the door frame 301 around the entire perimeter of the door 207, creating an RF seal. Conductive material 206 is shown in exemplary form as a wire mesh, covering bladder 204 in a recessed position while the door 207 is in a closed position, with the bladder awaiting inflation so as to create an RF seal. As will be recognized by those skilled in the art, many varieties of supporting structures, recessed channels, doors and brackets may be used to hold and support a bladder inside the edge perimeter of an RF shielded door. In order to create an RF seal upon bladder inflation, the exemplary bladder 204 extends completely around the edge perimeter of door 207. Further, in the exemplary embodiment shown, the bladder 204 is one piece, it being understood that the bladder need not be one piece. In alternative embodiments of the invention, multiple bladders may be employed, as well as combinations of bladders or overlapping bladders.

Figure 3:
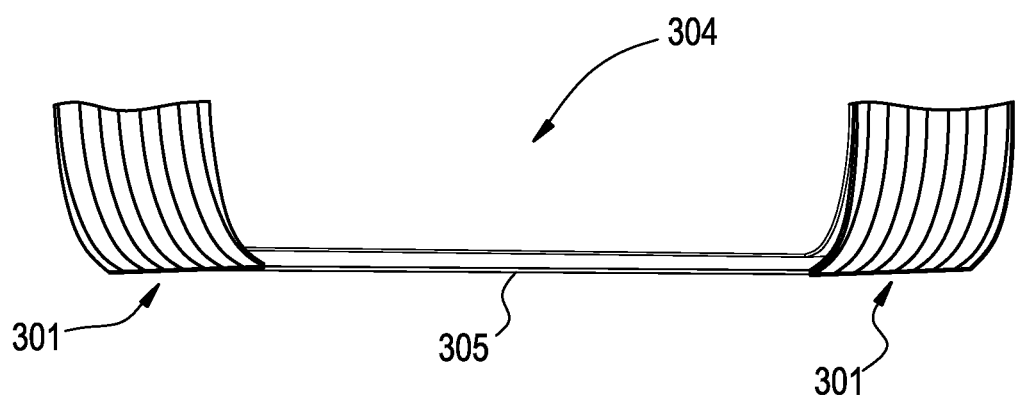
FIG. 3 illustrates a low-profile threshold compliant with ADA applicable standards according to an embodiment of the invention.

Another exemplary embodiment of the invention is depicted in FIG. 3. As shown, a door frame 301 includes a low-profile threshold 305. The threshold 305 may be substantially ¼ inch in height or whatever height is within the acceptable height of the ADA. The threshold 305 may be attachable to the door frame 301 as illustrated in FIG. 3 and allows an RF shielded door system using the invention to meet applicable standards of the ADA.

It should be noted that while the conductive material 206 is shown as a wire mesh, it may be any type of conductive material as long as a sufficient RF seal is created between a door and door frame according to the invention. Additional possible types of conductive materials include, but are not limited to, flexible metal cloths, sheets, or wire meshes of different gauges.

To ensure that a RF seal is created, contact between the conductive material 206 and conductive door jam 201 must be consistent. To that end, wire meshes according to the present invention, like wire mesh 206, are inherently flexible and maintain consistent contact even when a conductive door frame may be slightly damaged or have an inconsistent or uneven surface. In comparison, if the finger stock used in prior art door frames where damaged contact may not be consistent around the door perimeter; therefore creating sources of potential RF leakage. The ability of a flexible, conductive material to create an RF seal allows a so-shielded RF door to meet RF attenuation standards while requiring minimal, future maintenance. In alternative embodiments of the invention, the attenuation to the magnetic field provided by the inventive door systems of the present invention may be at least 20 dB at 1 KHz, 56 dB at 10 KHz, 90 dB at 100 KHz and 100 dB at 1 MHz; the attenuation to the electric field is at least 70 dB at 1 KHz and 100 dB at 10 KHz to 10 MHz; while the attenuation to plane waves is at least 100 dB at 100 MHz to 10 GHz.

In one embodiment of the invention, the conductive material 206 may be placeable so that it completely covers or encapsulates the bladder 204. In alternative embodiments, the conductive material may not completely cover the bladder, but only partially cover the bladder. Yet further, in still additional embodiments of the invention, the bladder 204 may itself be conductive and perform the function of the conductive material 206 shown in FIGS. 2A and 2B.

In use, after the door 207 is closed bladder 204 may be inflated and the conductive material 206 expanded outward to press against door jam 201, attachable to door frame 301, thereby creating a RF seal between the door 207 and the door frame 301. In additional embodiments of the invention, the inflation and deflation of the bladder 204 may be controlled by an exemplary control system illustratively shown in FIG. 4.

Figure 4:
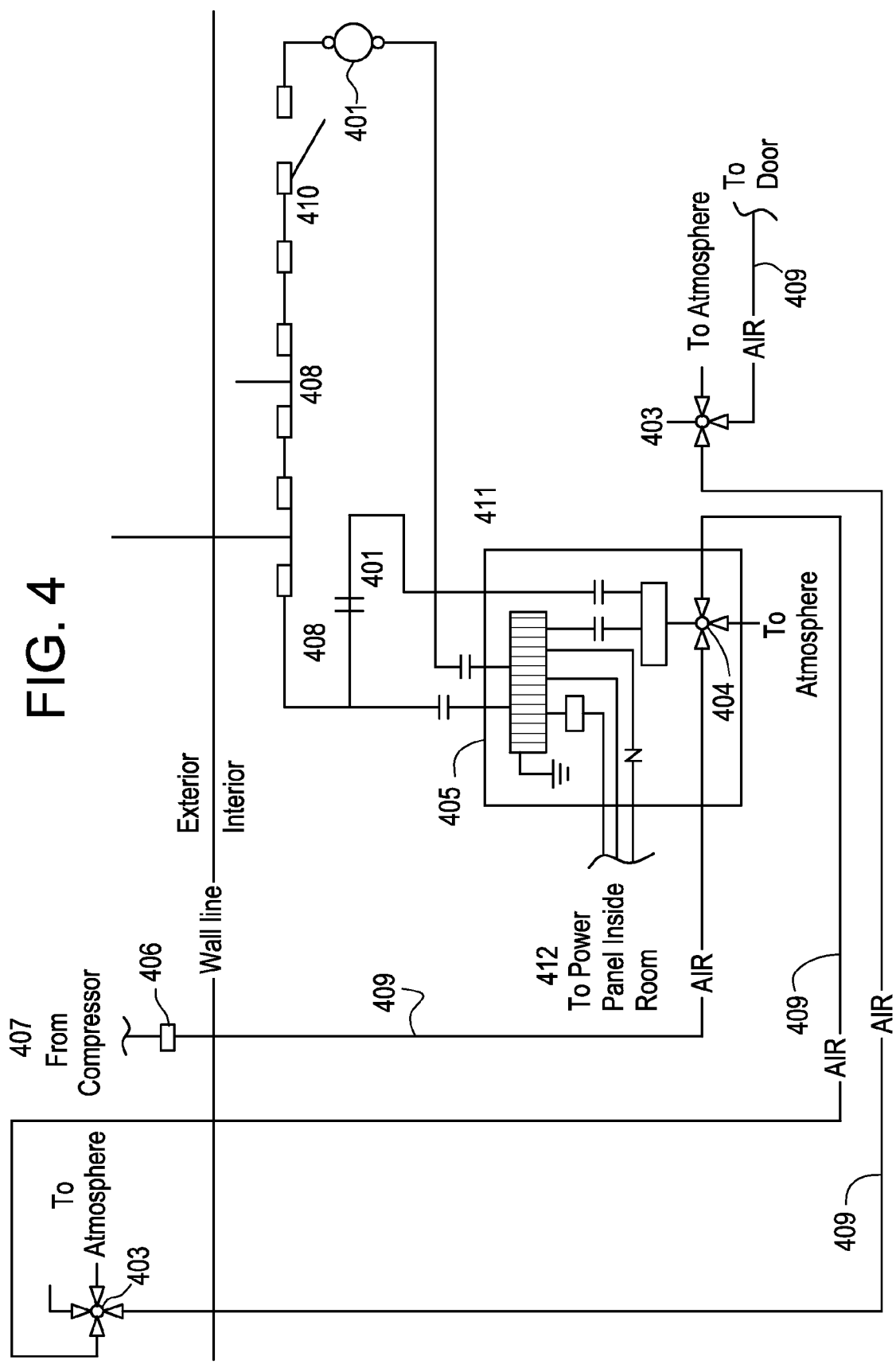
FIG. 4 is an example of a control subsystem for the inflation and deflation of a bladder according to an embodiment of the invention.

Generally speaking, the subsystem shown in FIG. 4 may include the following: means for supplying electrical power 412; means for inflating 407 the bladder 204 with compressed air; means for deflating the bladder 204 where such means may include an emergency means 403 for deflating said bladder when electrical power is not available; and means for controlling the inflation 406 of the bladder 204 in such a way that the bladder 204 contacts the conductive material 206 which in turn contacts the door frame 301 when the door 207 is in a closed position.

Optionally, the subsystem according to the invention may further include the following: means to prevent said bladder from inflating 410 if said door is open; means for delaying inflation 401 of the bladder 204 after the door 207 is in a closed position To prevent damage to the bladder 204, the control subsystem according to the invention may prevent the bladder 204 from being inflated unless the door 207 is in the closed position and the bladder 204 can properly expand against the door jam 201. In accordance with an exemplary method of the present invention, when door switch 410 is closed a time delay relay means 401 receives electric power and begins charging. When sufficiently charged, the time delay relay means 401 sends power to electric solenoid means 404 which in turn activates an air compression supply means, here illustratively shown as an air compressor and storage tank combination 407. Regulated, compressed air is supplied to the bladder 204 via regulation means (e.g., regulator) 406 to inflate the bladder 204. As the bladder is inflated, the conductive material 206 extends outward in all directions.

In one alternative embodiment of the invention, one or more corners of the door 207 may be substantially rounded, though other shapes may also be used.

Regulation means 406 insures that bladder 204 is not over-inflated or under-inflated. Compressed air inflates bladder 204 until the proper inflation air pressure is reached. In an exemplary embodiment, pressure is approximately 15 psi—a sufficient pressure level to adequately ensure a tight RF seal within the doorframe 301. Compressed air travels illustratively using flex hose 409 or similar means.

In accordance with an embodiment of the invention, the control system 400 also deflates the bladder 204 to open the door 207. In an exemplary embodiment, push button enter/exit controls or switches 408 may be used as well as a simple pull handle (not shown). The entry/exit controls 408 may be placed in a location that is convenient, such as inside or outside of an enclosure. The controls 408 activate the control subsystem according to the invention to allow the door to open. When a push button or switch 408 is pressed, air may be instantly released from bladder 204, allowing the door to swing freely. Once air is released, the door 207 may be opened manually using an available door handle (not shown). Time delay relay means 401 facilitates the release of the door 303. Optionally, the subsystem according to the invention may also include an emergency air valve 403 that is activated to deflate the bladder 204 when the door 207 is closed or a fail safe type of switch, not shown, that may be activated to prevent the bladder 204 from inflating if the door 207 is open. It should be understood that there are many different devices and combination of devices that may make up the means included within system 400, all of which are known to those skilled in the art. It is the novel combination of such means with and without the novel doors that forms embodiments of the invention.

In operation the door system may operate as follows to minimize RF leakage from the door 207: closing the door 207; activating a switch 408 that controls the bladder 204 located on an edge perimeter of the door 207; and then inflating the bladder 204 until the conductive material 206 substantially surrounding the bladder 204 contacts the door frame 301.

Conversely, before the door 207 is opened the bladder 204 should be deflated.

The foregoing discussion of exemplary embodiments of the invention has been presented for purposes of illustration and description. The embodiments presented are neither intended to be exhaustive nor limiting. Many modifications and variations may be envisioned by those skilled in the art in light of the above discussion. For example, the bladder and/or conductive material may be of different shapes, styles or types. Yet further, the bladder and/or conductive material may be placed on a door frame rather than on a door. Still further, a substance other than air may be used to inflate the bladder. The means for inflating the bladder 204 may be from external sources (e.g., from the atmosphere) or internal sources (e.g., completely contained within the shielded door system according to the invention) or combination of sources of air or other suitable substance(s). Further, the control means may be entirely mechanical or any combination of electrical and mechanical systems. It is explicitly intended that the scope of the invention be determined by the claims that follow and not by the discussion above.

We claim:

1. A radio-frequency shielded door system, comprising:
a door frame attachable to an opening in a radio frequency (RF) shielded enclosure;
a door, attachable to said door frame, to allow passage into and out of said RF shielded enclosure through a passageway;
a fixed, RF shielded threshold attachable to said door frame, for placement between a floor and said opening, where a height of said threshold does not exceed ¼;
a bladder for placement between the door and door frame;
an electrically conductive material for completely covering the bladder and between the bladder and door frame; and
a subsystem operable to inflate or deflate said bladder, wherein an inflated bladder contacts said conductive material which in turn contacts said door frame when said door is in a closed position, wherein the subsystem is further operable to inflate said bladder to an air pressure of 15 psi.

2. The system of claim 1 wherein the attenuation to the magnetic field is at least 20 dB at 1 KHz, 56 dB at 10 KHz, 90 dB at 100 KHz and 100 dB at 1 MHz.

3. The system of claim 1 wherein the attenuation to the electric field is at least 70 dB at 1 KHz and 100 dB at the frequencies 10 KHz to 10 MHz.

4. The system of claim 1 wherein the attenuation to plane waves is at least 100 dB at the frequencies 100 MHz to 10 GHz.

5. The system of claim 1 wherein said conductive material is a wire mesh.

6. The system of claim 1 wherein said conductive material electrically contacts said door frame around the entire perimeter of said door.

7. The system of claim 1 wherein one or more corners of said door are substantially rounded.

8. The system of claim 1 wherein said conductive material is placeable to encapsulate said bladder.

* * * * *